April 9, 1963 E. T. HANDELMAN 3,085,033

FABRICATION OF SEMICONDUCTOR DEVICES

Filed March 8, 1960

INVENTOR
E. T. HANDELMAN
BY [signature]
ATTORNEY

United States Patent Office 3,085,033

Patented Apr. 9, 1963

3,085,033

FABRICATION OF SEMICONDUCTOR DEVICES

Eileen T. Handelman, Short Hills, N.J., assignor to Bell Telephone Laboratories, Incorporated, New York, N.Y., a corporation of New York Filed Mar. 8, 1960, Ser. No. 13,686
10 Claims. (Cl. 148—1.5)

This invention relates to semiconductor devices and their manufacture.

More particularly, this invention relates to the formation of PN junctions.

It is well known in the art that P- and N-type semiconductor material form a PN junction at their mutual interface, and that there exists a depletion region associated with this junction.

As is also well known, the electrical characteristics of PN junction devices depend largely on the characteristics of this depletion region.

Recently, semiconductor PN junction devices in which the depletion region has a thickness of the order of 100 angstrom units have been shown to be desirable. This depletion region thickness coupled with suitably high impurity concentrations in the semiconductor material adjacent the depletion region provide the electrical characteristics of devices commonly designated Esaki or tunnel diodes.

One of the major continuing problems in the advancement of the tunnel diode from theory to application is the method for fabricating the device. Alloying techniques are being used at present. However, the area of the junctions produced by these techniques is difficult to control and, accordingly, the characteristics of the resulting devices vary.

Therefore, one object of this invention is a method for fabricating tunnel diodes having reproducible characteristics.

When the surface of a semiconductor crystal is heated in an oxidizing atmosphere an oxide of the semiconductor material forms on the affected surface. An interface between the oxide and the crystal results. As the oxidation continues the thickness of the oxide increases at the expense of the semiconductor material and the mutual interface moves into the crystal. This moving interface can be made to accumulate impurities before it. Consider, for example, a silicon crystal having a suitably high concentration of an appropriate P-type impurity uniformly distributed therein. If this crystal also includes an appropriate N-type impurity having a concentration relatively higher at a particular surface of the crystal but decreasing with distance from this surface, a PN junction exists. If the silicon has a much greater affinity for the N-type impurity than the oxide, the impurity will accumulate at the interface as the surface is heated in an oxidizing atmosphere. This thermal oxidation increases the concentration gradient of the N-type impurity with little effect on the position of the original PN junction. The result is a PN junction having a depletion region of the order of 100 angstroms wide.

Therefore, one feature of this invention is the thermal oxidation of a semiconductor crystal having two impurities of opposite conductivity therein, one impurity termed the dopant being uniformly distributed, the second impurity termed the diffusant having a concentration gradient and being further characterized by a low distribution coefficient. The distribution coefficient of an impurity for the purposes of this disclosure is the equilibrium concentration of the impurity in the oxide divided by the equilibrium concentration in the semiconductor material. A distribution coefficient is considered low if it is less than .01.

Further objects and features of this invention will become apparent during the detailed discussion rendered in relation to the drawing wherein.

It is to be understood that the drawings are for illustrative purposes only and, therefore, not necessarily to scale.

Figure 1:
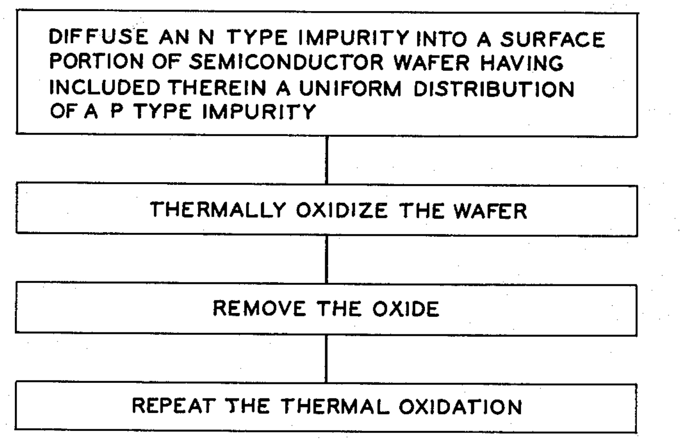
FIG. 1 is a flow chart illustrating the method of this invention.

Turning now to the drawing, as shown as the first step of the process illustrated by FIG. 1, one surface of a crystal of uniformly P-type monocrystalline silicon is exposed at a temperature typically higher than 1100 degrees centigrade to the vapor of a suitable N-type diffusant. As a result of this exposure, a portion of the crystal adjacent the exposed surface is converted to N-type conductivity. This provides a PN junction at the interface between the resulting N-type portion and the body of the wafer. As step 2, the wafer is next heated at a temperature of approximately 950 degrees centigrade in an oxidizing atmosphere to form an oxide coating over the surface into which the diffusant had been previously introduced. The temperature for this oxidation step is chosen to be low enough not to disturb substantially the location of the PN junction but high enough to provide substantial redistribution of he impurities initially in the neighborhood of the surface oxidized. Step 3 indicates the removal of the resulting oxide in order to take full advantage of a second oxidation step in accordance with the mechanism indicated above and described in detail below. The removal typically is accomplished by dissolving the oxide in hydrofluoric acid or by etching in accordance with well-known techniques. Step 4 indicates the reoxidation step necessary to achieve the desired steep impurity concentration gradient.

The redistribution of impurities accompanying each of the thermal oxidation steps is due to the ability of the thermally grown oxides to reject impurities characterized by low distribution coefficients. The mechanism involved is believed to be as follows: as a surface layer of silicon atoms is oxidized to silicon dioxide an interface between the oxide and the silicon is formed. As oxidation continues, the atoms of a second layer of silicon diffuse through the oxide layer and are in turn oxidized. The resulting increase in the oxide thickness at the expense of the silicon thickness can be considered a movement of the mutual interface into the silicon. As impurities are encountered by this moving interface, they go into the oxide or accumulate at the interface depending on their distribution coefficient. For example, impurities with high distribution coefficients for the silicon-silicon oxide system, such as boron and gallium, will pass into the oxide. On the other hand, impurities, such as antimony and arsenic, will accumulate at the interface. The resulting change in the distribution of the impurities can be understood readily be a consideration of FIGS. 3, 4, and 5 in order.

Figure 2:
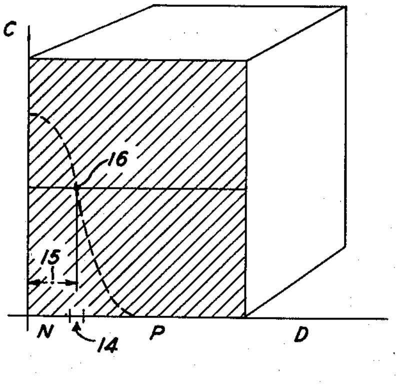
FIG. 2 is a graph depicting the distribution of the impurities as they appear initially. This graph is superimposed on a projectional view of a semiconductor wafer shown partially in cross section.

FIG. 2 depicts the impurity distributions and the relationship between the crystal surfaces and the PN junction desired in the crystal initially before any thermal oxidation. Typically, semiconductor material including the desired dopant is provided by growing a single semiconductor crystal from a melt including the impurity. However, the doped material is available commercially and the method for fabricating it is noncritical. What is critical is that the dopant be characterized by a high diffusion coefficient and a concentration in the order of $10^{19}$ atoms per cubic centimeter. A second impurity of a conductivity type opposite to that of the dopant typically is diffused into a surface of the doped crystal. The diffusant typically is characterized by a low distribution coefficient, a low diffusion coefficient, and a surface concentration in the order of $10^{20}$ atoms per cubic centimeter. In this and the following figures the distribution of the dopant will be represented by a solid line and the distribution of the diffusant by a broken line. The ordinate of the curves represents the impurity concentration C while the abscissa represents the depth D into the semiconductor wafer 10. The point of intersection of the solid and dotted curves determines the depth 15 of the PN junction 16.

Figure 3:
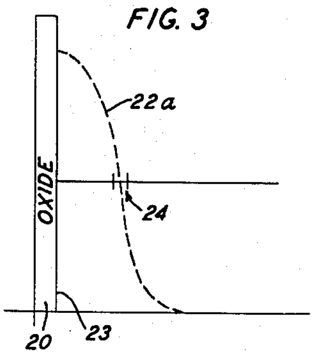

FIG. 3 shows the effect of thermal oxidation on the initial concentrations of the impurities. The oxide region 20 comprises atoms of silicon now oxidized. Impurity atoms initially positioned in the surface region now converted to the oxide region are accumulated by the advancing mutual interface 23 between the oxide and the silicon. Since the dopant has a relatively high diffusion rate in silicon, its distribution will be little changed by the oxidation. Since the diffusant is characterized by a low distribution coefficient and a low diffusion rate in silicon, its distribution will be changed substantially by the oxidation.

As the oxide thickness increases, the impurities initially in the surface region of the silicon are accumulated in increasing concentrations by the interface 23. The tendency then is to increase the gradient of the diffusant distribution curve. The tendency is augmented by oxidizing at a temperature substantially lower than the initial diffusion temperature because the depth of the PN junction, under this condition, remains relatively unchanged.

Figure 4:
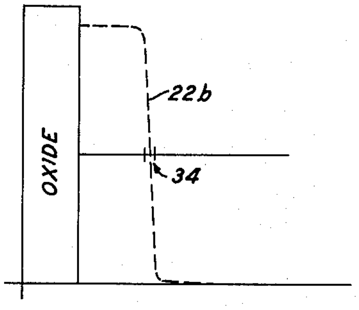
FIGS. 3, 4, and 5 are graphs similarly superimposed illustrating the change in the diffused impurity distribution during the subsequent thermal oxidation steps.

A comparison of FIGS. 2, 3, and 4 discloses the result. The depletion region is a function of the slope of the impurity distribution curves. The steeper the curve the thinner the depletion region. This thickness of the depletion region 14, 24, and 34 in the three figures respectively shows the decrease in thickness as the slope of the diffusant distribution curve becomes steeper in response to thermal oxidation. The change in the slope can be appreciated by comparing curves **22*a* and 22*b*** with the initial condition depicted in FIG. 2.

The method described above lends itself to application to slices of semiconductor crystalline material where the entire method is carried out prior to dividing the slice into individual wafers by well-known cutting techniques.

It is to be noted by further comparison of FIGS. 2, 3, and 4 that the surface concentration of impurities employed is increased by thermal oxidation. This is particularly advantageous if antimony is employed as the diffusant in this method. High surface concentrations of antimony are unobtainable without special and relatively costly techniques. In accordance with the subject invention, surface concentrations of antimony in the order of $10^{20}$ atoms per cubic centimeter of silicon have been achieved. The only limiting factors on this concentration are the solid solubility of the impurity in the semiconductor crystal at a given temperature and the diffusion rate of the impurity in the material.

Figure 5:
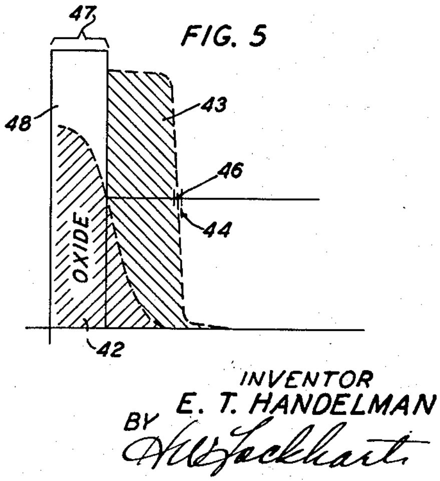

In FIG. 5, the volume of region 42 occupied by impurities initially will equal the volume of region 43 which is occupied by the accumulated impurities after the oxidation step. The thermal oxidation will result in a steeper slope for the diffusant distribution curve so long as the change in the position of the PN junction 46 is much smaller than the final thickness 47 of the grown oxide coating 48. Compliance with this condition is insured by thermal oxidation at a temperature substantially lower than the initial diffusion temperature.

Experiments indicate that the desired distribution of impurities is not ordinarily obtained on the first oxidation. Therefore, it is generally necessary to repeat the oxidation after the removal of the initial oxide coating. The effect of subsequent oxidation is entirely analogous to the effect of the initial oxidation.

The final result is shown in FIG. 5. The shape of the diffusant distribution curve approaches that of a step function and provides the desired thickness 44 for the depletion region associated with the PN junction.

The necessity for a grown oxide rather than a deposited oxide is evident from a consideration of the mechanism involved. Specifically, the interface between the semiconductor material and its oxide "moves" only when the oxide is grown. Further advantages are provided by oxides grown in accordance with the specific methods disclosed in Patent No. 2,899,344, issued August 11, 1959, to M. M. Atalla, E. J. Scheibner and E. Tannenbaum. In accordance with the subject invention the oxides may be grown as disclosed in this reference and may be removed or left undisturbed as desired. If the oxide is removed, the method of removal is of no particular consequence and the usual methods of removal such as etching, as noted above, are quite suitable.

A complete device includes a substantially ohmic contact affixed to the semiconductor wafer on each side of the PN junction. One method for fabricating suitable contacts is disclosed in copending application Serial No. 838,954 of M. M. Atalla and E. E. La Bate, filed September 9, 1959, now Patent No. 2,973,466. However, the high conductivity material employed in the fabrication of the subject diodes allows substantially ohmic contacts to be made simply by the evaporation of suitable metals such as aluminum and gold by well-known techniques.

The various combinations of semiconductor material, dopant and diffusant, suitable for the practice of this method are included in the following table.

*Table 1*

| Semiconductor | Dopant | Diffusant |
|---|---|---|
| silicon | boron | antimony. |
| | do | arsenic. |
| | aluminum | antimony. |
| | do | arsenic. |
| germanium | boron | Do. |
| | gallium | Do. |

Additional advantages due to the specific processes as disclosed in the above noted reference to Atalla et al. are restricted to silicon. Also, due to the low solubility of aluminum in silicon and the tendency of aluminum to form donors by interacting with the oxygen in the crystal during the heat treatment, aluminum is somewhat less adaptable to this method than the other dopants noted above.

Devices can be fabricated in accordance with this invention by employing as a starting material a slab of silicon semiconductor material typically .010 inch square by .005 inch thick and having distributed therein a dopant of one conductivity type. This slab is usually cut from a single crystal by well-known sawing techniques. The single crystal is prepared typically by well-known crystal growing or, alternatively, zone refining techniques. The dopant is uniformly distributed throughout the slab and has a concentration greater than $10^{19}$ atoms per cubic centimeter which is minimum for an operative tunnel diode. The starting material subsequently is heated to approximately 1200 degrees centigrade in an ambient vapor pressure of a diffusant of a conductivity type opposite to that of the dopant. The depth of the resulting junction will vary depending on the length of time of this heating step. For a time of 30 to 40 minutes the junction depth will be approximately 1700 to 1900 angstroms below the semiconductor surface. The slab then is heated in an oxidizing atmosphere, typically oxygen for silicon and steam for germanium, at a temperature well below the diffusion temperature noted above. This temperature is approximately 950 degrees centigrade for silicon and, for example, a run of two hours results in an oxide approximately 1000 angstroms thick. This oxide thickness corresponds to 450 angstroms of silicon converted to oxide.

More specifically, a silicon slab .010 inch square by .005 inch thick was cut by well-known sawing techniques from a single silicon crystal grown from a melt including a uniform boron concentration of $10^{19}$ atoms per cubic centimeter. The slab was heated at 1200 degrees centigrade in an ambient vapor pressure of antimony according to the well-known vapor-solid diffusion technique noted above. At this temperature the diffusion coefficient of antimony is $2\times10^{-13}$ cms.$^2$/sec. and a heat run of 36 minutes provided a PN junction 2000 angstroms below the surface. The 2000 angstroms were lapped from all but one major surface of the device. The concentration of antimony on the remaining surface was less than $10^{20}$ atoms per cubic centimeter. The slab was then oxidized at 950 degrees centigrade for two hours to provide an oxide layer 1000 angstroms thick corresponding, as noted above, to 450 angstroms of silicon. At this temperature the diffusion coefficient of antimony is on the order of $10^{-15}$ cms.$^2$/sec. accounting for the relatively small change in the depth of the junction of only about 250 angstroms during the oxidation. Therefore, after the oxidation step the junction is 1800 angstroms distant from the silicon to silicon oxide interface. The oxide was then removed by dissolving in a commercial solution of 48 percent hydrofluoric acid in water and the surface was reoxidized at 950 degrees centigrade for two hours. The result was a total junction depth of 1600 angstroms.

The concentration gradient at the junction after diffusion was calculated to be approximately $10^{24}$ cm.$^{-1}$. The gradient desired for a tunnel diode is of the order of $10^{26}$ cm.$^{-1}$. The decrease in the depth of the junction is proportional to the reciprocal of the concentration gradient. Additionally, the diffusion coefficient is approximately a factor of two larger for higher impurity concentrations and at the maximum concentration the impurities diffuse inwardly 350 angstroms per oxidation treatment. This contributes to the increase in the concentration gradient above. The result of the two effects on the gradient is to provide a sufficiently steep gradient on the third repetition of the oxidation step. The total depth of the junction beneath the oxide to silicon interface, decreasing over 200 angstroms on each oxidation, provides a total depth of less than 1300 angstroms after the third oxidation. Simultaneously, the impurities diffuse into the silicon at the rate of over 350 angstroms per oxidation at the higher concentrations down to 250 angstroms at the lower concentrations. After the third oxidation step the impurities diffused into the silicon from over 1100 angstroms under conditions of maximum concentrations to about 800 angstroms under conditions of minimum concentrations.

The number of repetitions necessary is impossible to determine exactly because the impurity distribution does not follow a well defined mathematical function after the first oxidation. However, four repetitions appear to be maximum for this system since the total depth of the junction would then be considerably less than 1000 angstroms. Further oxidation eventually would occasion a precipitation of the excess impurity when the concentration of the impurity in the semiconductor exceeds the solid solubility limit.

By adjusting the temperature of the oxidation step and/or the length of the oxidation run, the number of repetitions could be decreased. However, it appears that at least one repetition of the oxidation step is desirable to produce consistently high quality devices.

No effort has been made to exhaust the possible embodiments of this invention. It will be understood that the embodiment described is merely illustrative of the preferred form of the invention and various modifications may be made therein without departing from the scope and spirit of the invention.

For example, the effect of the oxide-silicon interface accumulating the diffusant may be achieved by selecting a diffusant characterized by a low diffusion coefficient in the oxide instead of a diffusant characterized by a low distribution coefficient. It should be noted, however, that in either case the diffusion coefficient of the diffusant in the semiconductor material is low.

Furthermore, although the invention has been described in terms of a dopant uniformly distributed throughout the starting crystal, it is intended that the dopant can be restricted to a portion of the crystal. In this instance, however, the invention is practiced only in that portion of the crystal wherein the dopant is uniformly distributed.

It is also contemplated that this invention can be practiced in more than one portion of a crystal.

What is claimed is:

1. In a method for fabricating a tunnel diode the steps of preparing a semiconductor crystal which is characterized by a surface portion which includes a substantially uniform concentration of a first impurity and a graded concentration of a second impurity, the concentration of said second impurity decreasing with increasing distance from the surface, the concentrations of said first and second impurities being such that there exists a PN junction in said surface portion, said second impurity having a low diffusion coefficient and a low distribution coefficient, said first impurity having a diffusion coefficient substantially higher than that of the second impurity and a distribution coefficient higher than that of the second impurity, heating said semiconductor crystal in an oxidizing atmosphere, said heating being for a time and at a temperature to grow a surface oxide over said surface portion whereby the depth of the PN junction below the surface of the semiconductor crystal decreases, removing the oxide and reheating the crystal to form a new surface oxide and to decrease still more the depth of the PN junction below the surface of the crystal.

2. In a method for fabricating a semiconductor device having therein a PN junction characterized by a depletion layer in the order of $10^2$ angstroms thick the steps of depositing a diffusant in at least one surface region of a semiconductor crystal having uniformly distributed therein a dopant of the opposite conductivity type, said diffusant being characterized by a low distribution coefficient, a low diffusion coefficient, and a surface concentration in the order of $10^{20}$ atoms per cubic centimeter, said dopant being characterized by a concentration in the order of $10^{19}$ atoms per cubic centimeter for forming a PN junction, heating said semiconductor crystal in an oxidizing atmosphere to form an oxide over at least said surface region whereby the depth of said PN junction below the surface of said crystal is decreased, removing the oxide coating and reheating in the oxidizing atmosphere.

3. In a method for fabricating tunnel diodes from a silicon wafer having a uniform boron concentration of at least $10^{19}$ atoms per cubic centimeter, the steps of depositing a significant impurity selected from a group comprising antimony and arsenic on a surface of said wafer, heating said surface at approximately 1200 degrees centigrade for more than 30 minutes, heating at approximately 950 degrees centigrade in an oxidizing atmosphere for about two hours to steepen the concentration gradient of said significant impurity, removing the resulting oxide coating, and repeating the oxidation step at least once.

4. In a method in accordance with claim 3 the step of depositing a significant impurity wherein said significant impurity is antimony.

5. In a method in accordance with claim 3 the step of depositing a significant impurity wherein said significant impurity is arsenic.

6. In a method for fabricating tunnel diodes from a germanium wafer having a uniform concentration of an impurity selected from a group comprising boron and gallium, said concentration being on the order of $10^{19}$ atoms per cubic centimeter, the steps of depositing arsenic on a surface of said wafer, the surface concentration of said arsenic being on the order of $10^{20}$ atoms per cubic centimeter, heating said surface at approximately 650 degrees centigrade for about 15 minutes, heating in an oxidizing atmosphere for about one hour, removing the resulting oxide coating and repeating the oxidation step at least once.

7. A method in accordance with claim 6 wherein said impurity having a uniform concentration comprises boron.

8. A method in accordance with claim 6 wherein said impurity having a uniform concentration comprises gallium.

9. In a method in accordance with claim 6 wherein said step of heating in an oxidizing atmosphere for about one hour is carried out in steam under pressure.

10. In a method for fabricating a semiconductor device the steps of growing a single silicon crystal from a melt including a uniform concentration of the order of $10^{19}$ atoms per cubic centimeter of boron, sawing a slice of material from said single crystal, heating said slice in a vapor of antimony at 1200 degrees centigrade for about 35 minutes to produce a surface concentration of antimony less than $10^{20}$ atoms per cubic centimeter, heating for about two hours at 950 degrees centigrade in an oxidizing atmosphere, washing in a solution of 48 percent hydrofluoric acid in water and reoxidizing at 950 degrees for about two hours.

References Cited in the file of this patent

UNITED STATES PATENTS

| | | |
|---|---|---|
| 2,818,361 | Anderson | Dec. 31, 1957 |
| 2,899,344 | Atalla et al. | Aug. 11, 1959 |
| 2,930,722 | Ligenza | Mar. 29, 1960 |
| 2,953,486 | Atalla | Sept. 20, 1960 |
| 3,001,896 | Marinace | Sept. 26, 1961 |

OTHER REFERENCES

Journal of Applied Physics, vol. 26, 1955, page 1520. "Removal of Copper From Germanium," Blodgett.

Physical Review, vol. 109, 1958, pages 603 and 604.

Journal of Applied Physics, vol. 29, No. 10, October 1958, page 1511.